United States Patent [19]

Fisher et al.

[11] 4,212,906

[45] Jul. 15, 1980

[54] METHOD FOR THE PRODUCTION OF CARBON/CARBON COMPOSITE MATERIAL

[75] Inventors: Ronald Fisher; Norman Smith, both of Rugby, England

[73] Assignee: Dunlop Limited, London, England

[21] Appl. No.: 943,854

[22] Filed: Sep. 19, 1978

Related U.S. Application Data

[62] Division of Ser. No. 822,824, Aug. 8, 1977, Pat. No. 4,134,360.

[30] Foreign Application Priority Data

Aug. 11, 1976 [GB] United Kingdom ............... 33339/76

[51] Int. Cl.$^2$ ............................................. B05D 3/12
[52] U.S. Cl. .................................... 427/237; 427/243; 427/245; 427/249
[58] Field of Search ............... 427/107, 105, 122, 228, 427/237, 296, 243, 245, 249

[56] References Cited

U.S. PATENT DOCUMENTS

| | | | |
|---|---|---|---|
| 1,986,319 | 1/1935 | Bongrand et al. | 427/296 |
| 2,817,605 | 12/1957 | Sanz et al. | 427/122 X |
| 3,748,995 | 7/1973 | Schroter et al. | 118/48 X |
| 3,944,686 | 3/1976 | Froberg | 427/228 |
| 3,970,768 | 7/1976 | Wilcox et al. | 427/122 X |
| 3,981,791 | 9/1976 | Rosvold | 118/49 X |

*Primary Examiner*—James R. Hoffman
*Attorney, Agent, or Firm*—Stevens, Davis, Miller & Mosher

[57] ABSTRACT

In the production of all-carbon composite articles by the cracking of a hydrocarbon gas to deposit carbon on a fibrous carbon substrate the substrate is held in the furnace by a ram movable in the furnace to engage the substrate. The gas is introduced inside the annular substrate and evacuated at a position spaced laterally from the substrate so that the gas is forced to disperse through the substrate wall.

4 Claims, 1 Drawing Figure

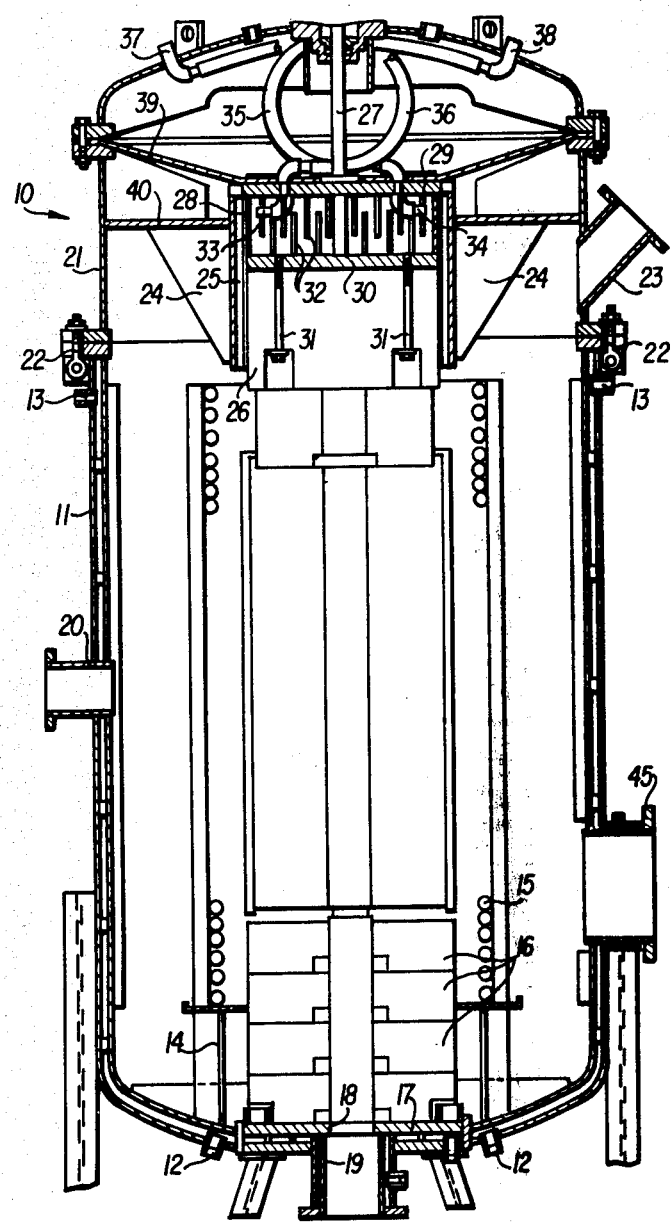

METHOD FOR THE PRODUCTION OF CARBON/CARBON COMPOSITE MATERIAL

This is a division of application Ser. No. 822,824 filed Aug. 8, 1977 and now U.S. Pat. No. 4,134,360.

The present invention relates to an improved method and apparatus for the production of carbon/carbon composite material and more particularly for the production of a carbon composite reinforced by carbon fibres and made by deposition of carbon on the carbon fibres by cracking of a hydrocarbon gas.

One of the uses of carbon fibre reinforced carbon composite material is in annular brake discs and in the production of these by carbon vapour deposition annular mats or substrates of carbon fibre material, for example of a woven or knitted textile material which has been carbonised, have been stacked with their central holes generally in alignment approximately to the thickness of the disc to be formed and the stacks have then been placed in individual jigs each consisting of two perforated plates of graphite bolted together to hold the plates at opposite ends of the stack and place it under a predetermined initial pressure. The individual jigs have then been placed in superimposed relation in an oven with spacer elements between adjacent jigs to allow gas to circulate between the jigs and between the lowermost jig and the bottom of the oven. A hydrocarbon gas is then introduced into the oven below the jigs and a sub-pressure is produced in the oven to draw the gas through the oven as it is subjected to cracking by heating means in the oven.

Among the difficulties which have been experienced in using the apparatus described above may be mentioned the fact that at least when using certain fibrous materials the jigs are liable to burst at some stage of the process.

An additional problem is that despite the perforations in the graphite plates they tend to impede dispersion of the through the fibrous material and the gas tends to circulate through the spaces between the jigs rather than through the fibrous material within each jig.

It is a principal object of the present invention to provide an improved method and apparatus for the production of all-carbon composite articles by the carbon vapour deposition process.

In accordance with one aspect of the present invention there is provided a method for the deposition of carbon on a fibrous substrate to produce an all-carbon composite article, the method comprising locating the fibrous substrate in a furnace provided interiorly with a ram, bringing the ram into contact with the substrate so that the substrate is subjected to pressure by the ram and cracking a hydrocarbon gas in the furnace to deposit carbon on the pressurised substrate.

The substrate may be annular and the gas admitted to and withdrawn from the furnace on opposite sides of the peripheral wall of the substrate so as to cause a forced dispersion of the gas through the material of the substrate.

Individual annular discs of fibrous material may be stacked in the furnace in coaxial relation to form a tubular substrate, or an elongated tubular substrate of fibrous material may be located in the furnace, and after completion of the densification process the tubular body may be removed from the furnace and parted along its length to form individual annular discs.

In accordance with another aspect of the invention there is provided apparatus for carrying out the method of the present invention, the apparatus comprising a furnace provided interiorly with a ram movable toward and away from an opposite part of the furnace interior, means for heating the furnace and means for admitting a hydrocarbon gas to the furnace interior and for withdrawing it therefrom, the arrangement being such that a fibrous substrate can be held under pressure in the furnace by the ram while the gas is cracked to deposit carbon on the substrate.

The ram is preferably water cooled. A water cooling jacket may be provided on the rear face of the ram to be movable therewith and may have flexible water inlet and outlet connections extending through a compartment of the furnace separated from the remainder of the furnace interior by a flexible diaphragm extending between the ram and the peripheral wall of the furnace.

The gas inlet means preferably penetrates a part of the furnace interior opposite the ram so as to discharge inside an annular substrate pressurised by the ram and the gas outlet means preferably penetrates the furnace wall at a position spaced laterally from the path of movement of the ram so as to be outside said substrate, the arrangement being such that when an annular substrate is pressurised by the ram gas passing from the inlet to the outlet means is forced to pass through the wall of the substrate.

The ram is preferably axially reciprocable and the heating means for the furnace preferably comprises a tubular arrangement of induction coils coaxial with the direction of movement of the ram and of diameter such as to surround a tubular substrate pressurised by the ram.

A preferred embodiment of the invention will now be described with reference to the accompanying drawing.

BRIEF DESCRIPTION OF THE DRAWING

The FIGURE is a sectional elevation of a furnace in accordance with the invention.

The furnace 10 illustrated has a double-walled lower part 11 provided with inlets 12 and outlets 13 for cooling water. In the lower part 11 an annular platform 14 supports induction coils 15, the electrical connections for which (not shown) penetrate the furnace through an entry port 45. Inside the platform 14 a stack of annular amorphous carbon blocks 16 rest on the floor 17 of the furnace, which is penetrated by an aperture 18 aligned with a gas admission port 19. A gas withdrawal port 20 is provided in the side of the furnace.

The furnace is closed by a cover 21 which is removable by releasing bolts 22. The cover 21 is formed with a port 23 for the introduction of sensors into the interior of the furnace, and it will be understood that the double wall of the lower part 11 of the furnace may also be formed with any necessary additional ports for the introduction of sensing or monitoring equipment.

At the centre of the cover 21 brackets 24 on a plate 40 support a tube 25 in which a ram 26 of refractory material is reciprocable, being mounted on the rod 27 of a piston-and-cylinder assembly (not shown) to be movable in a direction coaxial with the furnace. The ram is shown in a fully lowered position from which it is raised to permit amorphous carbon blocks corresponding to the blocks 16 to be stacked on top of a substrate located in the furnace, the ram being then lowered to compress the substrate between the upper and lower stacks of amorphous blocks so that the substrate is in the hottest part of the furnace. Interposed between the rod 27 and the ram 26 is a water jacket 28 comprising parallel top and bottom members 29 and 30 to which the rod and ram are respectively secured, the latter by means of bolts 31. Interdigitated baffle plates 32 extend from the top and bottom plates 29 and 30 and provide inside the jacket 28 a sinuous path for cooling water passing between an inlet 33 and an outlet 34 which are respectively connected to flexible pipes 35 and 36 which pass out of the cover at 37 and 38. The flexible pipes 35 and 36 allow circulation of water through the jacket 28 to be maintained throughout reciprocable travel of the ram 26 on the piston rod 27. The part of the interior of the cover 21 in which the pipes 35 and 36 are located is isolated from the remainder of the interior of the furnace by a flexible diaphragm 39 extending between and secured to the peripheral wall of the cover 21 and the rear face of the jacket 28, as well as by a plate 40 which supports the bracket 24.

In operation of the furnace 10 a tubular carbon fibre substrate is located in the furnace on the blocks 16 within the coils 15. This substrate may be a continuous tube from which annular brake discs will subsequently be made by parting the tube transversely at intervals along its length. Alternatively individual annular discs may be stacked one upon the other to form a tube of the required length. In either case the substrate may be made from loose or woven fibrous material which has been carbonised before location in the furnace, or which is uncarbonised or only partially carbonised before location in the furnace, the heat of the furnace being used both to carbonise or fully to carbonise the fibres and to effect the densification.

With the tubular substrate located in the furnace, the blocks 16 serving to ensure that all parts of the substrate are within the induction coils 15, the cover 21 is closed and the ram 26 is brought down onto the top end of the tubular substrate to subject it to a predetermined pressure. The coils 15 are energised to induce the required temperature in the substrate and a hydrocarbon gas is introduced through the opening 19. The outlet 20 for the gas is connected to means for producing a subatmospheric pressure so that the gas introduced into the interior of the substrate is forced to pass through the wall of the latter en route to the outlet 20. The induced heat causes carbon to be deposited from the gas onto the fibres of the substrate until the desired densification is achieved, whereupon the process is stopped and the tube, or individual discs, of carbon composite material removed from the furnace. If a continuous tube of carbon composite material has been produced it may then be parted at intervals along its length to produce individual brake discs.

Having now described our invention—what we claim is:

1. A method for the deposition of carbon on a fibrous compressible substrate to produce an all-carbon composite article, the method comprising locating the fibrous substrate in a furnace provided interiorly with a ram, bringing the ram into contact with the substrate so that the substrate is subjected to pressure by the ram and cracking a hydrocarbon gas in the furnace to deposit carbon on the pressurised substrate.

2. A method as claimed in claim 1, wherein the substrate is annular and wherein the gas is admitted to and withdrawn from the furnace on opposite sides of the peripheral wall of the substrate so as to cause a forced dispersion of the gas through the material of the substrate.

3. A method as claimed in claim 2 wherein individual annular discs of fibrous material are stacked in the furnace in coaxial relation to form a tubular substrate.

4. A method as claimed in claim 2 wherein an elongated tubular substrate of fibrous material is located in the furnace, and after completion of the densification process the tubular body is removed from the furnace and parted along its length to form individual annular discs.

* * * * *